United States Patent
Ogawa (10) Patent No.: US 12,080,555 B2
(45) Date of Patent: Sep. 3, 2024

(54) METHOD OF MANUFACTURING SEMICONDUCTOR DEVICE, NON-TRANSITORY COMPUTER-READABLE RECORDING MEDIUM AND SUBSTRATE PROCESSING APPARATUS

(71) Applicant: KOKUSAI ELECTRIC CORPORATION, Tokyo (JP)

(72) Inventor: Arito Ogawa, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 486 days.

(21) Appl. No.: 17/159,765

(22) Filed: Jan. 27, 2021

(65) Prior Publication Data

US 2021/0242023 A1 Aug. 5, 2021

(30) Foreign Application Priority Data

Jan. 31, 2020 (JP) ................................. 2020-014478

(51) Int. Cl.
*H01L 21/28* (2006.01)
*C23C 16/34* (2006.01)
(Continued)

(52) U.S. Cl.
CPC ........ *H01L 21/28088* (2013.01); *C23C 16/34* (2013.01); *C23C 16/45527* (2013.01);
(Continued)

(58) Field of Classification Search
CPC ........... H01L 21/28088; H01L 29/4966; H01L 21/02172; H01L 21/67011;
(Continued)

(56) References Cited

U.S. PATENT DOCUMENTS

2003/0003729 A1  1/2003  Yamasaki et al.
2004/0077184 A1  4/2004  Anderson et al.
(Continued)

FOREIGN PATENT DOCUMENTS

CN  1705768 A  12/2005
CN  100446218 C  12/2008
(Continued)

OTHER PUBLICATIONS

Taiwan Office Action dated Jan. 13, 2022 for Taiwan Patent Application No. 110103155.
(Continued)

*Primary Examiner* — Yasser A Abdelaziez
(74) *Attorney, Agent, or Firm* — Volpe Koenig (57) ABSTRACT

Described herein is a technique capable of suppressing the generation of particles due to a film peeling in a process chamber. According to one aspect of the technique, there is provided a method of manufacturing a semiconductor device, including: (a) loading a substrate with an oxide film formed thereon into a process chamber wherein a metal-containing film is formed on a wall or other location in the process chamber; (b) supplying into the process chamber with at least one among: a gas containing a group 14 element and hydrogen; and a gas containing oxygen; and (c) forming the metal-containing film on the substrate after (b).

17 Claims, 5 Drawing Sheets

(51) Int. Cl.
*C23C 16/455* (2006.01)
*C23C 16/458* (2006.01)
*C23C 16/52* (2006.01)
*H01L 29/49* (2006.01)

(52) U.S. Cl.
CPC .... *C23C 16/45544* (2013.01); *C23C 16/4583* (2013.01); *C23C 16/52* (2013.01); *H01L 29/4966* (2013.01)

(58) Field of Classification Search
CPC ......... H01L 21/67207; H01L 21/02186; H01L 21/0228; C23C 16/34; C23C 16/45527; C23C 16/45544; C23C 16/4583; C23C 16/52; C23C 16/4404; C23C 16/45553; C23C 16/45523
See application file for complete search history.

(56) References Cited

U.S. PATENT DOCUMENTS

| | | | |
|---|---|---|---|
| 2005/0039680 A1* | 2/2005 | Beaman | C23C 16/4404 427/248.1 |
| 2008/0041308 A1* | 2/2008 | Hong | H01J 37/3244 118/723 R |
| 2011/0108924 A1 | 5/2011 | Suzuki et al. | |
| 2013/0087174 A1* | 4/2013 | Sun | H01J 37/32449 134/30 |
| 2013/0178024 A1* | 7/2013 | Flachowsky | H01L 21/823807 257/E21.632 |
| 2015/0147482 A1 | 5/2015 | Kang et al. | |
| 2015/0303051 A1 | 10/2015 | Takeda | |
| 2017/0250086 A1 | 8/2017 | Urano et al. | |
| 2018/0277536 A1* | 9/2018 | Wu | H01L 21/823437 |
| 2019/0067015 A1* | 2/2019 | Wagatsuma | C23C 16/4581 |
| 2020/0194269 A1 | 6/2020 | Ogawa et al. | |

FOREIGN PATENT DOCUMENTS

| | | |
|---|---|---|
| CN | 109423625 A | 3/2019 |
| JP | 11-162880 A | 6/1999 |
| JP | 2003-221671 A | 8/2003 |
| JP | 2009-249680 A | 10/2009 |
| JP | 2010-118443 A | 5/2010 |
| JP | 2011-066263 A | 3/2011 |
| JP | 2015-207591 A | 11/2015 |
| JP | 2017-150059 A | 8/2017 |
| JP | 2019-044214 A | 3/2019 |
| KR | 2015-0060583 A | 6/2015 |
| WO | 2019/058608 A | 3/2019 |

OTHER PUBLICATIONS

Japanese Office Action dated Feb. 8, 2022 for Japanese Patent Application No. 2020-014478.
Korean Office Action dated Nov. 24, 2022 for Korean Patent Application No. 10-2021-0009094.
Chinese Office Action issued on Jul. 19, 2023 for China Patent Application No. 202110127537.
Chinese Office Action issued on Apr. 7, 2024 for Chinese Patent Application No. 202110127537.4.
Korean Office Action issued on Sep. 25, 2023 for Korean Patent Application No. 10-2021-0009094.

* cited by examiner

|  |  | COMPARATIVE EXAMPLE | FIRST EXAMPLE | SECOND EXAMPLE |
|---|---|---|---|---|
| Rms (nm) | 1.62 | 13.6 | 2.16 | 3.28 |
| Rmax (nm) | 25.7 | 85.5 | 22.9 | 32.3 |

METHOD OF MANUFACTURING SEMICONDUCTOR DEVICE, NON-TRANSITORY COMPUTER-READABLE RECORDING MEDIUM AND SUBSTRATE PROCESSING APPARATUS

CROSS-REFERENCE TO RELATED PATENT APPLICATION

This non-provisional U.S. patent application claims priority under 35 U.S.C. § 119 of Japanese Patent Application No. 2020-014478, filed on Jan. 31, 2020, in the Japanese Patent Office, the entire contents of which are hereby incorporated by reference.

BACKGROUND

1. Field

The present disclosure relates to a method of manufacturing a semiconductor device, a non-transitory computer-readable recording medium and a substrate processing apparatus.

2. Related Art

For example, a tungsten film (W film) whose resistance is low is used as a word line of a NAND flash memory or a DRAM of a three-dimensional structure. For example, according to some related arts, a titanium nitride film (TiN film) serving as a barrier film may be provided between the W film and an insulating film. The TiN film serves to improve the adhesion between the W film and the insulating film, and the TiN film and the W film may be formed (grown) on the TiN film by a nucleating type film-forming.

However, when a film such as the TiN film and the W film is formed by the nucleating type film-forming, the film may also be formed on an inner wall of a process chamber, a dummy substrate and the like. When an accumulative thickness of such film becomes significant, the film may peel off because the film grows abnormally into large crystal grains.

SUMMARY

Described herein is a technique capable of capable of suppressing the generation of particles due to film peeling in a process chamber.

According to one aspect of the technique of the present disclosure, there is provided a method of manufacturing a semiconductor device including: (a) loading a substrate with an oxide film formed thereon into a process chamber wherein a metal-containing film is formed on a wall or other location in the process chamber; (b) supplying into the process chamber with at least one among: a gas containing a group 14 element and hydrogen; and a gas containing oxygen; and (c) forming the metal-containing film on the substrate after (b).

DETAILED DESCRIPTION

Embodiments

Hereinafter, one or more embodiments (hereinafter, simply referred to as "embodiments") according to the technique of the present disclosure will be described with reference to FIGS. 1 through 4.

(1) Configuration of Substrate Processing Apparatus

Figure 1:
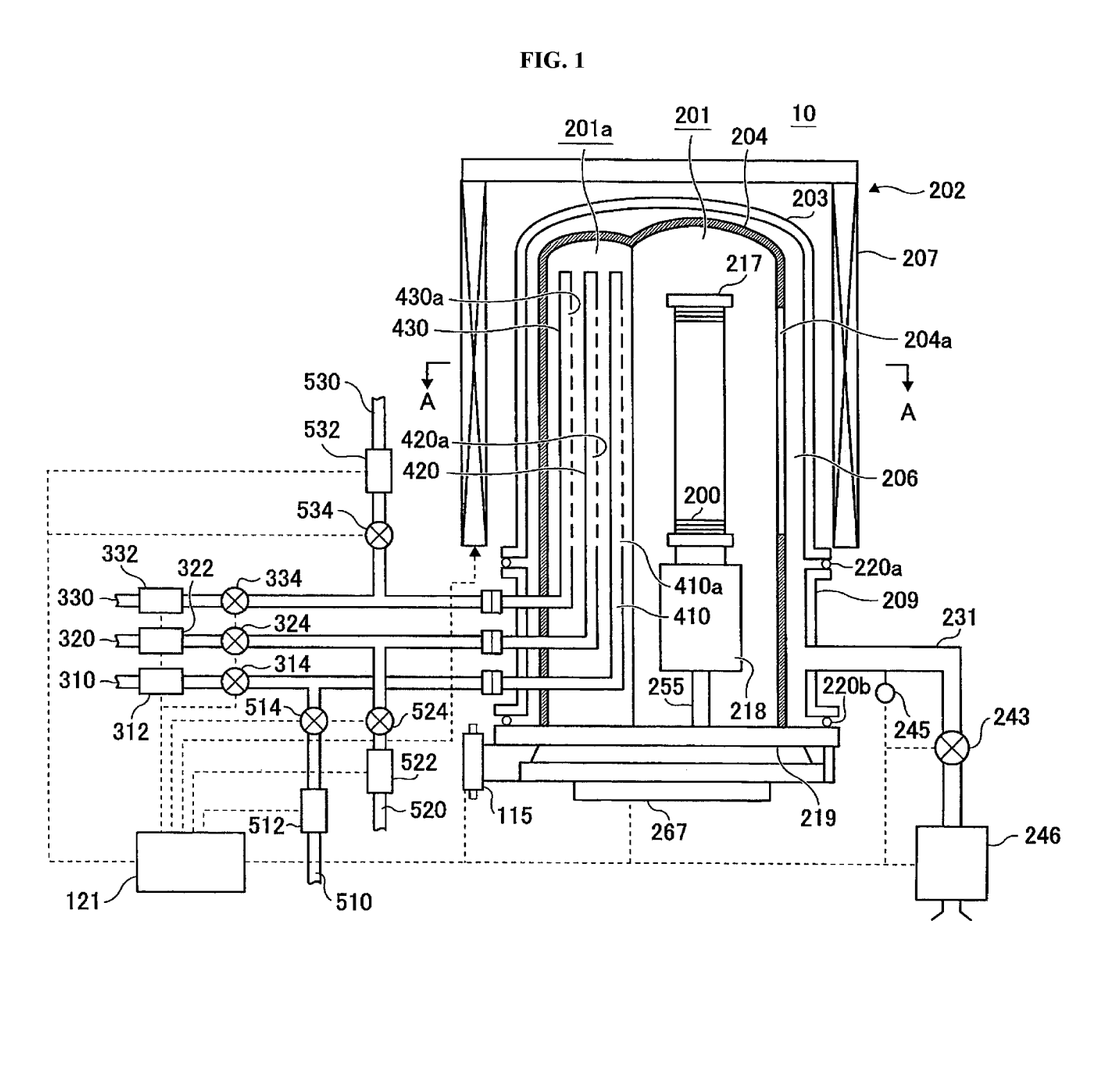
FIG. 1 schematically illustrates a vertical cross-section of a vertical type process furnace of a substrate processing apparatus according to one or more embodiments described herein.

A substrate processing apparatus 10 includes a process furnace 202 provided with a heater 207 serving as a heating structure (which is a heating device or a heating system). The heater 207 is of a cylindrical shape, and is vertically installed while being supported by a heater base (not shown) serving as a support plate.

An outer tube 203 constituting a reaction tube (which is a reaction vessel or a process vessel) is provided in an inner side of the heater 207 to be aligned in a manner concentric with the heater 207. For example, the outer tube 203 is made of a heat resistant material such as quartz ($SiO_2$) and silicon carbide (SiC). The outer tube 203 is of a cylindrical shape with a closed upper end and an open lower end. A manifold (which is an inlet flange) 209 is provided under the outer tube 203 to be aligned in a manner concentric with the outer tube 203. The manifold 209 is made of a metal such as stainless steel (SUS). The manifold 209 is of a cylindrical shape with open upper and lower ends. An O-ring 220a serving as a seal is provided between the upper end of the manifold 209 and the outer tube 203. As the manifold 209 is supported by the heater base (not shown), the outer tube 203 is installed vertically.

An inner tube 204 constituting the reaction vessel (process vessel) is provided in an inner side of the outer tube 203. For example, the inner tube 204 is made of a heat resistant material such as quartz and SiC. The inner tube 204 is of a cylindrical shape with a closed upper end and an open lower end. The process vessel (reaction vessel) is constituted mainly by the outer tube 203, the inner tube 204 and the manifold 209. A process chamber 201 is provided in a hollow cylindrical portion of the process vessel (that is, an inside of the inner tube 204).

The process chamber 201 is configured to accommodate a plurality of wafers including a wafer 200 serving as a substrate vertically in a horizontal orientation in a multistage manner by a boat 217 described later.

Figure 2:
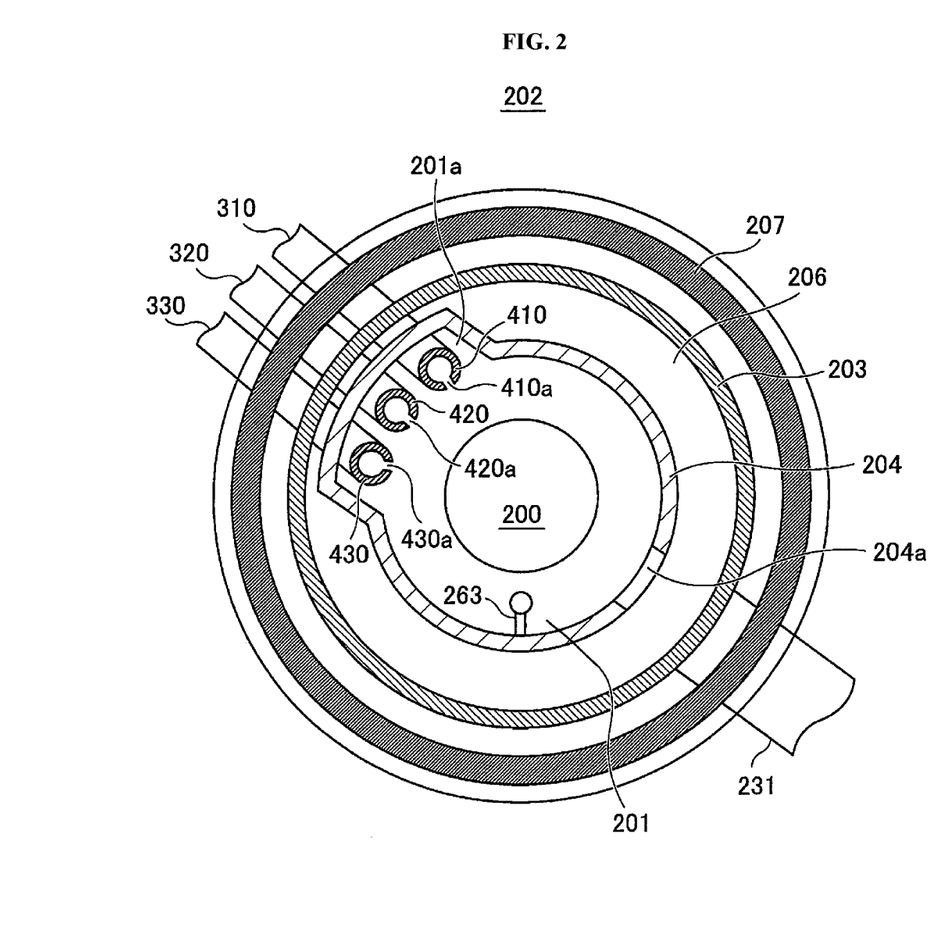
FIG. 2 schematically illustrates a horizontal cross-section taken along the line A-A' of the vertical type process furnace of the substrate processing apparatus according to the embodiments shown in FIG. 1.

Nozzles 410, 420 and 430 are installed in the process chamber 201 so as to penetrate side walls of the manifold 209 and the inner tube 204. Gas supply pipe 310, 320 and 330 are connected to the nozzles 410, 420 and 430, respectively. However, the process furnace 202 of the present embodiments is not limited to the example described above.

Mass flow controllers (MFCs) 312, 322 and 332 serving as flow rate controllers (flow rate control devices) and valves 314, 324 and 334 serving as opening/closing valves are sequentially installed at the gas supply pipes 310, 320 and 330 from upstream sides to downstream sides of the gas supply pipes 310, 320 and 330, respectively. Gas supply pipes 510, 520 and 530 configured to supply an inert gas are connected to the gas supply pipes 310, 320 and 330 at downstream sides of the valves 314, 324 and 334, respectively. MFCs 512, 522 and 532 serving as flow rate controllers (flow rate control devices) and valves 514, 524 and 534 serving as opening/closing valves are sequentially installed at the gas supply pipes 510, 520 and 530 from upstream sides to downstream sides of the gas supply pipes 510, 520 and 530, respectively.

The nozzles 410, 420 and 430 are connected to front ends (tips) of the gas supply pipes 310, 320 and 330, respectively. Each of the nozzles 410, 420 and 430 may include an L-shaped nozzle. Horizontal portions of the nozzles 410, 420 and 430 are installed so as to penetrate the side walls of the manifold 209 and the inner tube 204. Vertical portions of the nozzles 410, 420 and 430 protrude outward in a radial direction of the inner tube 204 and are installed in a spare chamber 201a of a channel shape (a groove shape) extending in the vertical direction. That is, the vertical portions of the nozzles 410, 420 and 430 are installed in the spare chamber 201a toward the upper end of the inner tube 204 (in a direction in which the plurality of the wafers including the wafer 200 are arranged) and along an inner wall of the inner tube 204.

The nozzles 410, 420 and 430 extend from a lower region of the process chamber 201 to an upper region of the process chamber 201. The nozzles 410, 420 and 430 are provided with a plurality of gas supply holes 410a, a plurality of gas supply holes 420a and a plurality of gas supply holes 430a facing the plurality of the wafers including the wafer 200, respectively. Thereby, a process gas can be supplied to the plurality of the wafers through the plurality of the gas supply holes 410a of the nozzle 410, the plurality of the gas supply holes 420a of the nozzle 420 and the plurality of the gas supply holes 430a of the nozzle 430. The plurality of the gas supply holes 410a, the plurality of the gas supply holes 420a and the plurality of the gas supply holes 430a are provided from a lower portion to an upper portion of the inner tube 204. An opening area of each of the gas supply holes 410a, the gas supply holes 420a and the gas supply holes 430a is the same, and each of the gas supply holes 410a, the gas supply holes 420a and the gas supply holes 430a is provided at the same pitch. However, the plurality of the gas supply holes 410a, the plurality of the gas supply holes 420a and the plurality of the gas supply holes 430a are not limited thereto. For example, the opening area of each of the gas supply holes 410a, the gas supply holes 420a and the gas supply holes 430a may gradually increase from the lower portion to the upper portion of the inner tube 204 to further uniformize a flow rate of the gas supplied through the plurality of the gas supply holes 410a, the plurality of the gas supply holes 420a and the plurality of the gas supply holes 430a.

The plurality of the gas supply holes 410a of the nozzle 410, the plurality of the gas supply holes 420a of the nozzle 420 and the plurality of the gas supply holes 430a of the nozzle 430 are provided from a lower portion to an upper portion of the boat 217 described later. Therefore, the process gas supplied into the process chamber 201 through the plurality of the gas supply holes 410a, the plurality of the gas supply holes 420a and the plurality of the gas supply holes 430a is supplied onto the plurality of the wafers including the wafer 200 accommodated in the boat 217 from the lower portion to the upper portion thereof, that is, the entirety of the plurality of the wafers accommodated in the boat 217. It is preferable that the nozzles 410, 420 and 430 extend from the lower region to the upper region of the process chamber 201. However, the nozzles 410, 420 and 430 may extend only to the vicinity of a ceiling of the boat 217.

A source gas containing metal (which is a metal-containing gas) serving as the process gas is supplied into the process chamber 201 through the gas supply pipe 310 provided with the MFC 312 and the valve 314 and the nozzle 410. As the source gas, for example, a halogen-based source (which is a halide or a halogen-based titanium source) gas such as titanium tetrachloride ($TiCl_4$) gas containing titanium (Ti) as a metal element may be used.

A gas containing a group 14 element and hydrogen (H) serving as the process gas is supplied into the process chamber 201 through the gas supply pipe 320 provided with the MFC 322 and the valve 324 and the nozzle 420. As the gas containing the group 14 element and hydrogen, for example, a silane-based gas such as monosilane ($SiH_4$) gas containing silicon (Si) and hydrogen may be used.

A reactive gas serving as the process gas and reacting with the source gas is supplied into the process chamber 201 through the gas supply pipe 330 provided with the MFC 332 and the valve 334 and the nozzle 430. As the reactive gas, for example, a nitrogen (N)-containing gas containing nitrogen may be used. For example, ammonia ($NH_3$) gas may be used as the nitrogen-containing gas.

The inert gas such as the nitrogen ($N_2$) gas is supplied into the process chamber 201 through the gas supply pipes 510, 520 and 530 provided with the MFCs 512, 522 and 532 and the valves 514, 524 and 534, respectively, and the nozzles 410, 420 and 430. While the present embodiments will be described by way of an example in which the $N_2$ gas is used as the inert gas, the inert gas according to the present embodiments is not limited thereto. For example, instead of the $N_2$ gas, a rare gas such as argon (Ar) gas, helium (He) gas, neon (Ne) gas and xenon (Xe) gas may be used as the inert gas.

A process gas supply system is constituted mainly by the gas supply pipes 310, 320 and 330, the MFCs 312, 322 and 332 the valves 314, 324 and 334 and the nozzles 410, 420, 430. However, only the nozzles 410, 420, 430 may be considered as the process gas supply system. The process gas supply system may also be simply referred to as a "gas supply system". When the source gas is supplied through the gas supply pipe 310, a source gas supply system is constituted mainly by the gas supply pipe 310, the MFC 312 and the valve 314. The source gas supply system may further include the nozzle 410. When the silane-based gas is supplied through the gas supply pipe 320, a silane-based gas supply system is constituted mainly by the gas supply pipe 320, the MFC 322 and the valve 324. The silane-based gas supply system may further include the nozzle 420. When the reactive gas is supplied through the gas supply pipe 330, a reactive gas supply system is constituted mainly by the gas supply pipe 330, the MFC 332 and the valve 334. The reactive gas supply system may further include the nozzle 430. When the nitrogen-containing gas serving as the reactive gas is supplied through the gas supply pipe 330, the reactive gas supply system may also be referred to as a "nitrogen-containing gas supply system". An inert gas supply system is constituted mainly by the gas supply pipes 510, 520 and 530, the MFCs 512, 522 and 532 and the valves 514, 524 and 534.

According to the present embodiments, the gas is supplied into a vertically long annular space which is defined by the inner wall of the inner tube 204 and the edges (peripheries) of the plurality of the wafers including the wafer 200 through the nozzles 410, 420 and 430 provided in the spare chamber 201*a*. The gas is ejected into the inner tube 204 through the plurality of the gas supply holes 410*a* of the nozzle 410, the plurality of the gas supply holes 420*a* of the nozzle 420 and the plurality of the gas supply holes 430*a* of the nozzle 430 facing the plurality of the wafers. Specifically, the gas such as the source gas is ejected into the inner tube 204 in a direction parallel to the surfaces of the plurality of the wafers through the plurality of the gas supply holes 410*a* of the nozzle 410, the plurality of the gas supply holes 420*a* of the nozzle 420 and the plurality of the gas supply holes 430*a* of the nozzle 430.

An exhaust hole (exhaust port) 204*a* facing the nozzles 410, 420 and 430 is provided at the side wall of the inner tube 204. For example, the exhaust hole 204*a* may be of a narrow slit shape elongating vertically. The gas supplied into the process chamber 201 through the plurality of the gas supply holes 410*a* of the nozzle 410, the plurality of the gas supply holes 420*a* of the nozzle 420 and the plurality of the gas supply holes 430*a* of the nozzle 430 flows over the surfaces of the plurality of the wafers including the wafer 200. The gas that has flowed over the surfaces of the plurality of the wafers is exhausted through the exhaust hole 204*a* into a gap (that is, an exhaust path 206) provided between the inner tube 204 and the outer tube 203. The gas flowing in the exhaust path 206 flows into an exhaust pipe 231 and is then discharged out of the process furnace 202.

The exhaust hole 204*a* is provided to face the plurality of the wafers including the wafer 200. The gas supplied in the vicinity of the plurality of the wafers in the process chamber 201 through the plurality of the gas supply holes 410*a*, the plurality of the gas supply holes 420*a* and the plurality of the gas supply holes 430*a* flows in the horizontal direction. The gas that has flowed in the horizontal direction is exhausted through the exhaust hole 204*a* into the exhaust path 206. The exhaust hole 204*a* is not limited to a slit-shaped throughhole. For example, the exhaust hole 204*a* may be configured as a plurality of holes.

The exhaust pipe 231 configured to exhaust an inner atmosphere of the process chamber 201 is installed at the manifold 209. A pressure sensor 245 serving as a pressure detector (pressure detecting structure) configured to detect an inner pressure of the process chamber 201, an APC (Automatic Pressure Controller) valve 243 and a vacuum pump 246 serving as a vacuum exhaust apparatus are sequentially installed at the exhaust pipe 231 from an upstream side to a downstream side of the exhaust pipe 231. With the vacuum pump 246 in operation, the APC valve 243 may be opened or closed to vacuum-exhaust the process chamber 201 or stop the vacuum exhaust. With the vacuum pump 246 in operation, an opening degree of the APC valve 243 may be adjusted in order to adjust the inner pressure of the process chamber 201. An exhaust system is constituted mainly by the exhaust hole 204*a*, the exhaust path 206, the exhaust pipe 231, the APC valve 243 and the pressure sensor 245. The exhaust system may further include the vacuum pump 246.

A seal cap 219 serving as a furnace opening lid capable of airtightly sealing a lower end opening of the manifold 209 is provided under the manifold 209. The seal cap 219 is in contact with the lower end of the manifold 209 from thereunder. The seal cap 219 is made of a metal such as SUS, and is of a disk shape. An O-ring 220*b* serving as a seal is provided on an upper surface of the seal cap 219 so as to be in contact with the lower end of the manifold 209. A rotator 267 configured to rotate the boat 217 accommodating the plurality of the wafers including the wafer 200 is provided at the seal cap 219 opposite to the process chamber 201. A rotating shaft 255 of the rotator 267 is connected to the boat 217 through the seal cap 219. As the rotator 267 rotates the boat 217, the plurality of the wafers are rotated. The seal cap 219 may be elevated or lowered in the vertical direction by a boat elevator 115 serving as an elevator provided outside the outer tube 203 vertically. When the seal cap 219 is elevated or lowered in the vertical direction by the boat elevator 115, the boat 217 may be transferred (loaded) into the process chamber 201 or transferred (unloaded) out of the process chamber 201. The boat elevator 115 serves as a transfer device (which is a transfer structure or a transfer system) that loads the boat 217 and the plurality of the wafers including the wafer 200 accommodated in the boat 217 into the process chamber 201 or unloads the boat 217 and the plurality of the wafers including the wafer 200 accommodated in the boat 217 out of the process chamber 201.

The boat 217 serving as a substrate retainer is configured to accommodate (support) the plurality of the wafers including the wafer 200 (for example, 25 to 200 wafers) while the plurality of the wafers are horizontally oriented with their centers aligned with each other with predetermined intervals therebetween in a multistage manner. For example, the boat 217 is made of a heat resistant material such as quartz and SiC. An insulating plate 218 horizontally oriented is provided under the boat 217 in a multistage manner (not shown). The insulating plate 218 is made of a heat resistant material such as quartz and SiC. The insulating plate 218 suppresses the transmission of the heat from the heater 207 to the seal cap 219. However, the present embodiments are not limited thereto. For example, instead of the insulating plate 218, a heat insulating cylinder (not shown) such as a cylinder made of a heat resistant material such as quartz and SiC may be provided under the boat 217.

As shown in FIG. 2, a temperature sensor 263 serving as a temperature detector is installed in the inner tube 204. An amount of the current supplied to the heater 207 is adjusted based on temperature information detected by the temperature sensor 263 such that a desired temperature distribution of an inner temperature of the process chamber 201 can be obtained. Similar to the nozzles 410, 420 and 430, the temperature sensor 263 is L-shaped, and is provided along the inner wall of the inner tube 204.

Figure 3:
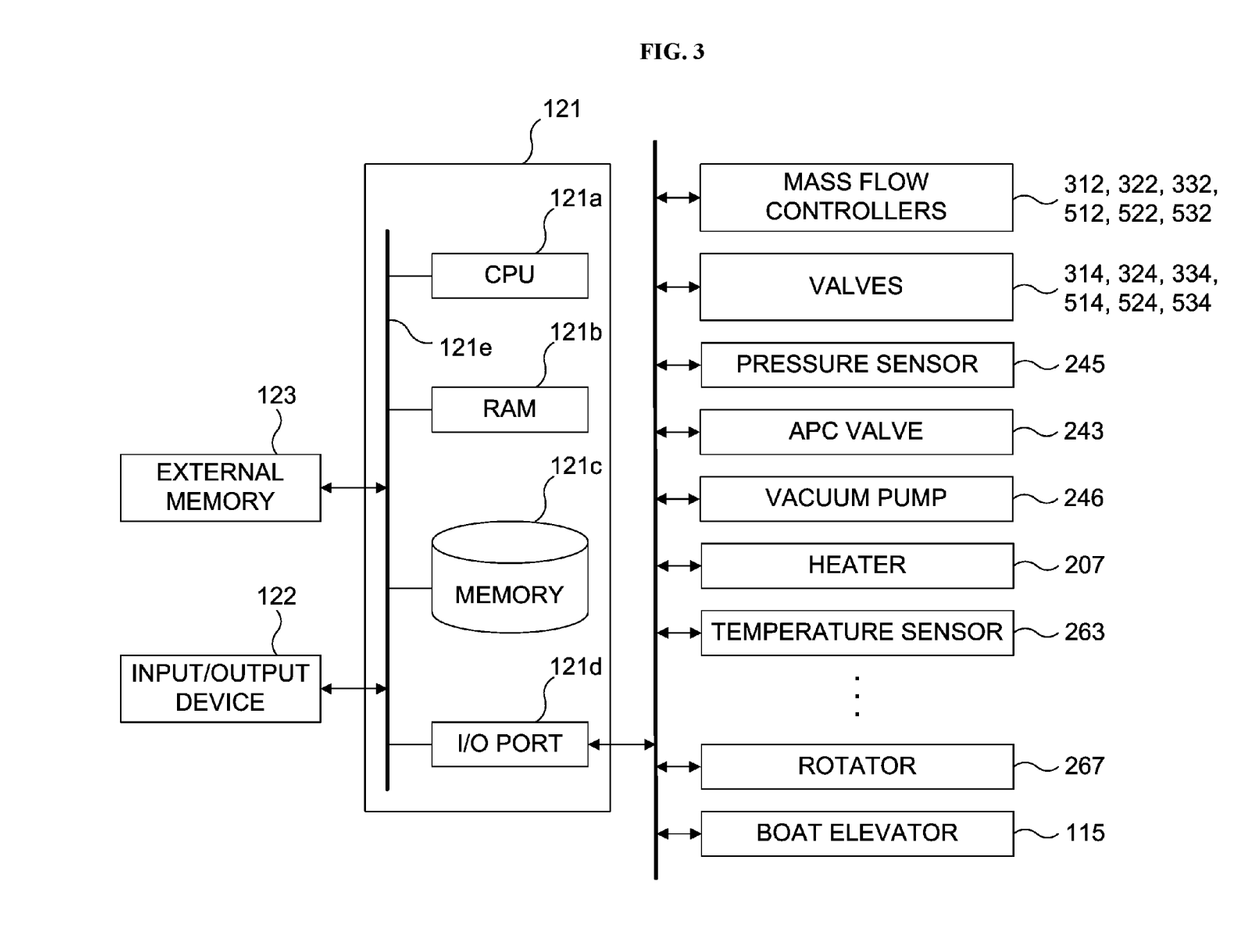
FIG. 3 is a block diagram schematically illustrating a configuration of a controller and related components of the substrate processing apparatus according to the embodiments described herein.

As shown in FIG. 3, a controller 121 serving as a control device (control structure) is constituted by a computer including a CPU (Central Processing Unit) 121*a*, a RAM (Random Access Memory) 121*b*, a memory 121*c* and an I/O port 121*d*. The RAM 121*b*, the memory 121*c* and the I/O port 121*d* may exchange data with the CPU 121*a* through an internal bus 121*e*. For example, an input/output device 122 such as a touch panel is connected to the controller 121.

The memory 121*c* is configured by components such as a flash memory and a hard disk drive (HDD). For example, a control program configured to control the operation of the substrate processing apparatus 10 or a process recipe containing information on the sequences and conditions of a method of manufacturing a semiconductor device described later is readably stored in the memory 121*c*. The process recipe is obtained by combining steps of the method of manufacturing the semiconductor device described later such that the controller 121 can execute the steps to acquire a predetermine result, and functions as a program. Hereafter, the process recipe and the control program may be collectively or individually referred to as a "program". In the present specification, the term "program" may indicate only the process recipe, may indicate only the control program, or may indicate a combination of the process recipe and the control program. The RAM 121b functions as a memory area (work area) where a program or data read by the CPU 121a is temporarily stored.

The I/O port 121d is connected to the above-described components such as the MFCs 312, 322, 332, 512, 522 and 532, the valves 314, 324, 334, 514, 524 and 534, the pressure sensor 245, the APC valve 243, the vacuum pump 246, the heater 207, the temperature sensor 263, the rotator 267 and the boat elevator 115.

The CPU 121a is configured to read a control program from the memory 121c and execute the read control program. In addition, the CPU 121a is configured to read a recipe from the memory 121c in accordance with an operation command inputted from the input/output device 122. According to the contents of the read recipe, the CPU 121a may be configured to control various operations such as flow rate adjusting operations for various gases by the MFCs 312, 322, 332, 512, 522 and 532, opening/closing operations of the valves 314, 324, 334, 514, 524 and 534, an opening/closing operation of the APC valve 243, a pressure adjusting operation by the APC valve 243 based on the pressure sensor 245, a temperature adjusting operation by the heater 207 based on the temperature sensor 263, a start and stop of the vacuum pump 246, an operation of adjusting the rotation and the rotation speed of the boat 217 by the rotator 267, an elevating and lowering operation of the boat 217 by the boat elevator 115 and an operation of transferring and accommodating the wafer 200 into the boat 217.

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as an MO and a semiconductor memory such as a USB memory and a memory card. The memory 121c or the external memory 123 may be embodied by a non-transitory computer readable recording medium. Hereafter, the memory 121c and the external memory 123 are collectively or individually referred to as recording media. In the present specification, the term "recording media" may indicate only the memory 121c, may indicate only the external memory 123, and may indicate both of the memory 121c and the external memory 123. Instead of the external memory 123, a communication means such as the Internet and a dedicated line may be used for providing the program to the computer.

(2) Substrate Processing

Figure 4:
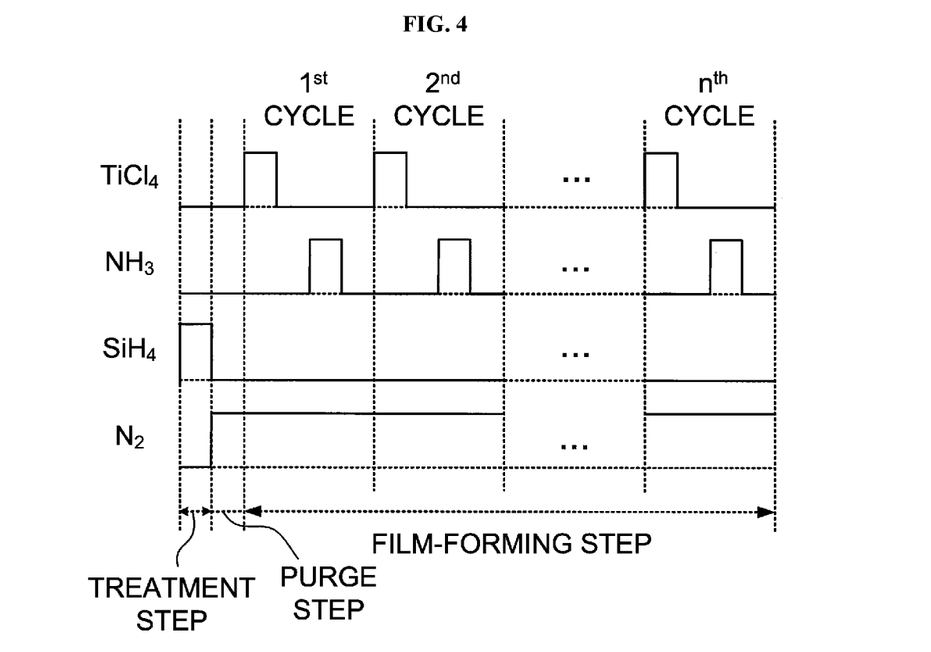
FIG. 4 is a flow chart schematically illustrating a film-forming sequence according to the embodiments described herein.

Hereinafter, as a part of manufacturing processes of a semiconductor device, an exemplary substrate processing of forming a titanium nitride film (TiN film) on the wafer 200 on which an oxide film exists will be described with reference to FIG. 4. FIG. 4 is a flow chart schematically illustrating a film-forming sequence according to the embodiments described herein. The substrate processing of forming the TiN film is performed using the process furnace 202 of the substrate processing apparatus 10 described above. By performing a film-forming step of forming the TiN film described later at least once in the process furnace 202, the TiN film is formed in the process chamber 201. In the following description, the operations of the components constituting the substrate processing apparatus 10 are controlled by the controller 121. For example, a product wafer to be manufactured by the substrate processing includes a shallow trench isolation (STI) used for a semiconductor device, in which a silicon oxide film ($SiO_2$ film) is formed in a groove formed on a silicon (Si) substrate and the TiN film is formed on the $SiO_2$ film. The TiN film is used as a gate electrode.

The substrate processing (of manufacturing a semiconductor device) according to the present embodiments may include: (a) loading the wafer 200 with the silicon oxide film ($SiO_2$ film) serving as the oxide film formed thereon into the process chamber 201 wherein the TiN film serving as a metal-containing film is formed on an inner wall or other location in the process chamber 201; (b) supplying into the process chamber 201 with at least one among: a silane gas (that is, the silane-based gas) serving as the gas containing the group 14 element and hydrogen; and an $O_2$ gas serving as a gas containing oxygen (O); and (c) forming the TiN film serving as the metal-containing film on the wafer 200, wherein (c) is performed after (b) is performed.

In (b), an oxide film (such as a TiNO film and a TiO film) or a film containing the group 14 element and hydrogen is formed on such locations as the inner wall (wall) of the process chamber 201 and a dummy substrate serving as the insulating plate 218 in the process chamber 201.

In (c), the TiN film serving as the metal-containing film is formed on the wafer 200 by alternately and repeatedly performing: supplying the $TiCl_4$ gas serving as the metal-containing gas to the wafer 200 and supplying the $NH_3$ gas serving as the reactive gas to the wafer 200.

When the TiN film is formed on the wafer 200 by a nucleating type film-forming, the TiN film is also formed on such locations as the inner wall of the process chamber 201 and the dummy substrate. When an accumulative thickness of the TiN film formed as above becomes significant, the TiN film may peel off because the TiN film grows abnormally into large crystal grains. As a result, particles may be generated. According to the present embodiments, the wafer 200 with the oxide film such as the $SiO_2$ film formed thereon is transferred (loaded) into the process chamber 201. Then, before the TiN film is formed on the wafer 200, a treatment step described later is performed. As the treatment step is performed a step of supplying into the process chamber 201 with the gas containing the group 14 element and hydrogen or a step of supplying into the process chamber 201 with the gas containing oxygen (O). As a result, it is possible to suppress the occurrence of film peeling caused by disintegration of the crystal grains of the TiN film formed on such locations as the inner wall (wall) of the process chamber 201 and the dummy substrate. The reasons are as follows. Crystal grain fragmentation films are formed to cause disintegration of the crystal grains by reforming a surface of the TiN film into titanium silicon nitride (TiSiN) or oxidizing the surface of the TiN film into titanium oxynitride (TiNO) or titanium oxide (TIO). That is, by stopping the growth of the TiN film and flattening the TiN film, it is possible to suppress the occurrence of the film peeling. Further, the wafer 200 is not affected by the treatment step since the wafer 200 with the oxide film such as the $SiO_2$ film formed thereon is loaded into the process chamber 201 before the treatment step is performed. That is, it is possible to selectively disintegrate the crystal grains of the TiN film formed on such locations as the inner wall of the process chamber 201 and the dummy substrate in the process chamber 201, and it is also possible to form the crystal grain fragmentation film only on the surface of the TiN film formed on such locations as the inner wall of the process chamber 201 and the dummy substrate.

In the present specification, the term "wafer" may refer to "a wafer itself" or may refer to "a wafer and a stacked structure of a predetermined layer (or layers) or a film (or films) formed on a surface of the wafer". In the present specification, the term "a surface of a wafer" may refer to "a surface of a wafer itself" or may refer to "a surface of a predetermined layer or a film formed on a wafer". In the present specification, the term "substrate" and "wafer" may be used as substantially the same meaning.

<Wafer Loading>

The plurality of the wafers including the wafer 200 are charged (transferred) into the boat 217 (wafer charging). After the boat 217 is charged with the plurality of the wafers, as shown in FIG. 1, the boat 217 charged with the plurality of the wafers is elevated by the boat elevator 115 and loaded (transferred) into the process chamber 201 with the TiN film formed therein (boat loading). With the boat 217 loaded, the seal cap 219 seals a lower end opening of the outer tube 203 via the O-ring 220b.

<Pressure and Temperature Adjusting>

The vacuum pump 246 vacuum-exhausts the inner atmosphere of the process chamber 201 until the inner pressure of the process chamber 201 reaches and is maintained at a desired pressure (vacuum degree). In the pressure and temperature adjusting, the inner pressure of the process chamber 201 is measured by the pressure sensor 245, and the APC valve 243 is feedback-controlled based on measured pressure information (pressure adjusting). The vacuum pump 246 continuously vacuum-exhausts the inner atmosphere of the process chamber 201 until at least the processing of the wafer 200 is completed. The heater 207 heats the process chamber 201 until the inner temperature of the process chamber 201 reaches and is maintained at a desired temperature. In the pressure and temperature adjusting, the amount of the current supplied to the heater 207 is feedback-controlled based on the temperature information detected by the temperature sensor 263 such that the desired temperature distribution of the inner temperature of the process chamber 201 is obtained (temperature adjusting). The heater 207 continuously heats the process chamber 201 until at least the processing of the wafer 200 is completed.

<Treatment Step ($SiH_4$ Gas Supply)>

The valve 324 is opened to supply the $SiH_4$ gas serving as the silane-based gas (that is, the gas containing the group 14 element and hydrogen) into the gas supply pipe 320. A flow rate of the $SiH_4$ gas supplied into the gas supply pipe 320 is adjusted by the MFC 322. The $SiH_4$ gas whose flow rate is adjusted is then supplied into the process chamber 201 through the plurality of the gas supply holes 420a of the nozzle 420, and is exhausted through the exhaust pipe 231. Thereby, the $SiH_4$ gas is supplied to the plurality of the wafers including the wafer 200. In parallel with the supply of the $SiH_4$ gas, the valve 524 is opened to supply the inert gas such as the $N_2$ gas into the gas supply pipe 520. A flow rate of the $N_2$ gas supplied into the gas supply pipe 520 is adjusted by the MFC 522. The $N_2$ gas whose flow rate is adjusted is then supplied into the process chamber 201 together with the $SiH_4$ gas, and is exhausted through the exhaust pipe 231. In the treatment step, the valves 514 and 534 are closed to stop the supply of the $SiH_4$ gas through the nozzles 410 and 430.

In the treatment step, the APC valve 243 is fully opened. A supply flow rate of the $SiH_4$ gas controlled by the MFC 322 may be set to a flow rate ranging from 0.1 slm to 10 slm.

For example, the supply flow rate of the $SiH_4$ gas may be set to 2 slm. A supply flow rate of the $N_2$ gas controlled by the MFC 522 may be set to a flow rate ranging from 0.1 slm to 20 slm. The inner pressure of the process chamber 201 in the treatment step is set to be lower than the inner pressure of the process chamber 201 in the film-forming step described later. In addition, the flow rate of the gas such as the $SiH_4$ gas supplied in the treatment step is set to be smaller than the flow rate of the gas such as the $TiCl_4$ gas supplied in the film-forming step described later. As a result, it is possible to distribute the $SiH_4$ gas throughout the process chamber 201, and it is also possible to selectively perform the treatment step only for the TiN film formed on such locations as the inner wall of the process chamber 201 and the dummy substrate without affecting the wafer 200 serving as the product wafer.

In the treatment step, a temperature of the heater 207 is set such that a temperature of the wafer 200 reaches and is maintained at a temperature ranging from 350° C. to 500° C. The temperature of the wafer 200 (that is, the inner temperature of the process chamber 201) in the treatment step is set to be higher than the temperature of the wafer 200 (that is, the inner temperature of the process chamber 201) in the film-forming step described later. It is preferable that the temperature of the wafer 200 in the treatment step is equal to or less than 500° C. When the temperature of the wafer 200 in the treatment step is higher than 500° C., an incubation time is shortened, and a silicon film (Si film) may be formed on the wafer 200.

In the treatment step, the $SiH_4$ gas and the $N_2$ gas are supplied into the process chamber 201 without any other gas being supplied into the process chamber 201 together with the $SiCl_4$ gas and the $N_2$ gas. By supplying the $SiH_4$ gas, a titanium silicon nitride film (TiSiN film) serving as the crystal grain fragmentation film is formed on the surface of the TiN film formed on such locations as the inner wall of the process chamber 201, and the surface of the TiN film is flattened. A supply time (time duration) of supplying the $SiH_4$ gas is within the incubation time which is the time during which the silicon film is not formed on the wafer 200. For example, the supply time (time duration) of supplying the $SiH_4$ gas may be set to a time ranging from about 3 minutes to about 5 minutes.

<Purge Step>

After about 3 minutes to about 5 minutes have elapsed from the supply of the $SiH_4$ gas, the valve 324 is closed to stop the supply of the $SiH_4$ gas. In the purge step, with the APC valve 243 of the exhaust pipe 231 open, the vacuum pump 246 vacuum-exhausts the inner atmosphere of the process chamber 201 to remove a residual gas in the process chamber 201 such as the $SiH_4$ gas which did not react or which contributed to the formation of the TiSiN film from the process chamber 201. In the purge step, with the valve 524 open, the valves 514 and 534 are opened to supply the $N_2$ gas into the process chamber 201. The $N_2$ gas serves as a purge gas, which improves the efficiency of removing the residual gas in the process chamber 201 such as the $SiH_4$ gas which did not react or which contributed to the formation of the TiSiN film from the process chamber 201.

<Film-Forming Step>

<$TiCl_4$ Gas Supply, First Step>

The valve 314 is opened to supply the $TiCl_4$ gas serving as the source gas into the gas supply pipe 310. A flow rate of the $TiCl_4$ gas supplied into the gas supply pipe 310 is adjusted by the MFC 312. The $TiCl_4$ gas whose flow rate is adjusted is then supplied into the process chamber 201 through the plurality of the gas supply holes 410a of the nozzle 410, and is exhausted through the exhaust pipe 231. Thereby, the TiCl$_4$ gas is supplied to the plurality of the wafers including the wafer 200. In parallel with the supply of the TiCl$_4$ gas, the valve 514 is opened to supply the inert gas such as the N$_2$ gas into the gas supply pipe 510. A flow rate of the N$_2$ gas supplied into the gas supply pipe 510 is adjusted by the MFC 512. The N$_2$ gas whose flow rate is adjusted is then supplied into the process chamber 201 together with the TiCl$_4$ gas, and is exhausted through the exhaust pipe 231. In the first step, in order to prevent the TiCl$_4$ gas from entering the nozzles 420 and 430, the valves 524 and 534 may be opened to supply the N$_2$ gas into the gas supply pipes 520 and 530. The N$_2$ gas is supplied into the process chamber 201 through the gas supply pipes 320 and 330 and the nozzles 420 and 430, and is exhausted through the exhaust pipe 231.

In the first step, the APC valve 243 is appropriately adjusted (controlled) to adjust the inner pressure of the process chamber 201 to a pressure ranging from 1 Pa to 3,990 Pa. For example, the inner pressure of the process chamber 201 is adjusted to 1,000 Pa. A supply flow rate of the TiCl$_4$ gas controlled by the MFC 312 may be set to a flow rate ranging from 0.1 slm to 2.0 slm. Each supply flow rate of the N$_2$ gas controlled by the MFCs 512, 522 and 532 may be set to a flow rate ranging from 0.1 slm to 20 slm. The inner pressure of the process chamber 201 in the first step is set to be higher than the inner pressure of the process chamber 201 in the treatment step described above. In addition, the flow rate of the gas such as the TiCl$_4$ gas supplied in the first step is set to be greater than the flow rate of the gas such as the SiH$_4$ gas supplied in the treatment step described above. In the first step, the temperature of the heater 207 is set such that the temperature of the wafer 200 reaches and is maintained at a temperature ranging from 300° C. to 500° C. For example, the temperature of the wafer 200 in the first step is set to 475° C.

In the first step, the TiCl$_4$ gas and the N$_2$ gas are supplied into the process chamber 201 without any other gas being supplied into the process chamber 201 together with the TiCl$_4$ gas and the N$_2$ gas. By supplying the TiCl$_4$ gas, a titanium-containing layer is formed on the wafer 200 (that is, a base film on the surface) on which the oxide film exists. The titanium-containing layer may refer to a titanium layer containing chlorine (Cl), may refer to an adsorption layer of the TiCl$_4$, or may refer to both of the titanium layer containing chlorine and the adsorption layer of the TiCl$_4$.

<Residual Gas Removing: Second Step>

After a predetermined time (for example, 0.01 second to 10 seconds) has elapsed from the supply of the TiCl$_4$ gas, the valve 314 is closed to stop the supply of the TiCl$_4$ gas. In the purge step, with the APC valve 243 of the exhaust pipe 231 open, the vacuum pump 246 vacuum-exhausts the inner atmosphere of the process chamber 201 to remove a residual gas in the process chamber 201 such as the TiCl$_4$ gas which did not react or which contributed to the formation of the titanium-containing layer from the process chamber 201. In the purge step, with the valves 514, 524 and 534 open, the N$_2$ gas is continuously supplied into the process chamber 201. The N$_2$ gas serves as the purge gas, which improves the efficiency of removing the residual gas in the process chamber 201 such as the TiCl$_4$ gas which did not react or which contributed to the formation of the titanium-containing layer from the process chamber 201.

<NH$_3$ Gas Supply: Third Step>

After the residual gas in the process chamber 201 is removed from the process chamber 201, the valve 334 is opened to supply the NH$_3$ gas serving as the reactive gas into the gas supply pipe 330. A flow rate of the NH$_3$ gas supplied into the gas supply pipe 330 is adjusted by the MFC 332. The NH$_3$ gas whose flow rate is adjusted is then supplied into the process chamber 201 through the plurality of the gas supply holes 430a of the nozzle 430, and is exhausted through the exhaust pipe 231. Thereby, the NH$_3$ gas is supplied to the plurality of the wafers including the wafer 200. In parallel with the supply of the NH$_3$ gas, the valve 534 is opened to supply the inert gas such as the N$_2$ gas into the gas supply pipe 530. A flow rate of the N$_2$ gas supplied into the gas supply pipe 530 is adjusted by the MFC 532. The N$_2$ gas whose flow rate is adjusted is then supplied into the process chamber 201 together with the NH$_3$ gas, and is exhausted through the exhaust pipe 231. In the third step, in order to prevent the NH$_3$ gas from entering the nozzles 410 and 420, the valves 514 and 524 may be opened to supply the N$_2$ gas into the gas supply pipes 510 and 520. The N$_2$ gas is supplied into the process chamber 201 through the gas supply pipes 310 and 320 and the nozzles 410 and 420, and is exhausted through the exhaust pipe 231.

In the third step, the APC valve 243 is appropriately adjusted (controlled) to adjust the inner pressure of the process chamber 201 to a pressure ranging from 1 Pa to 3,990 Pa. For example, the inner pressure of the process chamber 201 is adjusted to 1,000 Pa. A supply flow rate of the NH$_3$ gas controlled by the MFC 332 may be set to a flow rate ranging from 0.1 slm to 30 slm. Each supply flow rate of the N$_2$ gas controlled by the MFCs 512, 522 and 532 may be set to a flow rate ranging from 0.1 slm to 30 slm. A supply time (time duration) of supplying the NH$_3$ gas to the wafer 200 may be set to a time ranging from 0.01 second to 30 seconds. In the third step, the temperature of the heater 207 is set equal to the temperature of the heater 207 in the TiCl$_4$ gas supply (that is, the first step).

In the third step, the NH$_3$ gas and the N$_2$ gas are supplied into the process chamber 201 without any other gas being supplied into the process chamber 201 together with the NH$_3$ gas and the N$_2$ gas. A substitution reaction occurs between the NH$_3$ gas and at least a portion of the titanium-containing layer formed on the wafer 200 in the first step. During the substitution reaction, titanium (Ti) contained in the titanium-containing layer and nitrogen (N) contained in the NH$_3$ gas are bonded. As a result, a titanium nitride layer (TiN layer) is formed on the wafer 200 on which the oxide film exists.

<Residual Gas Removing: Fourth Step>

After the TiN layer is formed, the valve 334 is closed to stop the supply of the NH$_3$ gas. Then, a residual gas in the process chamber 201 such as the NH$_3$ gas which did not react or which contributed to the formation of the TiN layer and reaction byproducts is removed from the process chamber 201 in the same manners as in the second step.

<Performing a Predetermined Number of Times>

By performing a cycle wherein the first step through the fourth step described above are sequentially performed in order a predetermined number of times (n times), the TiN film of a predetermined thickness is formed on the wafer 200 on which the oxide film exists.

<After-Purge and Returning to Atmospheric Pressure>

The N$_2$ gas is supplied into the process chamber 201 through the gas supply pipes 510, 520 and 530, and is exhausted through the exhaust pipe 231. The N$_2$ gas serves as the purge gas, and the inner atmosphere of the process chamber 201 is purged with the N$_2$ gas (inert gas). Thus, the residual gas in the process chamber 201 or by-products remaining in the process chamber 201 are removed from the process chamber 201 (after-purge). Thereafter, the inner atmosphere of the process chamber 201 is replaced with the inert gas (substitution by inert gas), and the inner pressure of the process chamber 201 is returned to the normal pressure (atmospheric pressure) (returning to atmospheric pressure).

<Wafer Unloading>

Thereafter, the seal cap 219 is lowered by the boat elevator 115 and the lower end opening of the outer tube 203 is opened. The boat 217 with the plurality of processed wafers including the wafer 200 charged therein is unloaded out of the outer tube 203 through the lower end opening of the outer tube 203 (boat unloading). Then, the plurality of the processed wafers including the wafer 200 are discharged (transferred) out of the boat 217 (wafer discharging).

(3) Effects According to Present Embodiments

According to the present embodiments, before forming the TiN film of a predetermined thickness (for example, 250 Å) on the wafer 200 on which the oxide film exists, the surface of the TiN film on such locations as the inner wall of the process chamber 201 is converted to titanium silicon nitride (TiSiN). Thereby, the TiSiN film (crystal grain fragmentation film) containing the group 14 element is formed. The TiSiN film is an amorphous film, and the formation of the TiSiN film causes to disintegrate the crystal grains of the TiN film. As a result, the growth of the TiN film by the nucleating type film-forming is stopped (disintegrated). Therefore, it is possible to suppress the film peeling of the TiN film formed in the process chamber 201, and it is also possible to prevent the TiN film formed in the process chamber 201 from adhering to the wafer 200 as a foreign substance. That is, it is possible to suppress the generation of the particles due to the film peeling of the TiN film in the process chamber 201 (that is, in the reaction tube). In addition, since the treatment step performed with the boat 217 accommodating the plurality of the wafers including the wafer 200 loaded into the process chamber 201, it is possible to suppress the film peeling of the TiN film formed on the boat 217 or the dummy substrate accommodated in the boat 217. Therefore, it is possible to improve the throughput.

(4) Modification Example

Subsequently, a modified example of the above-described embodiments will be described in detail. In the following description, features of the modified example different from those of the above-described embodiments will be described in detail below, and the description of features of the modified example the same as those of the above-described embodiments will be omitted.

Figure 5:
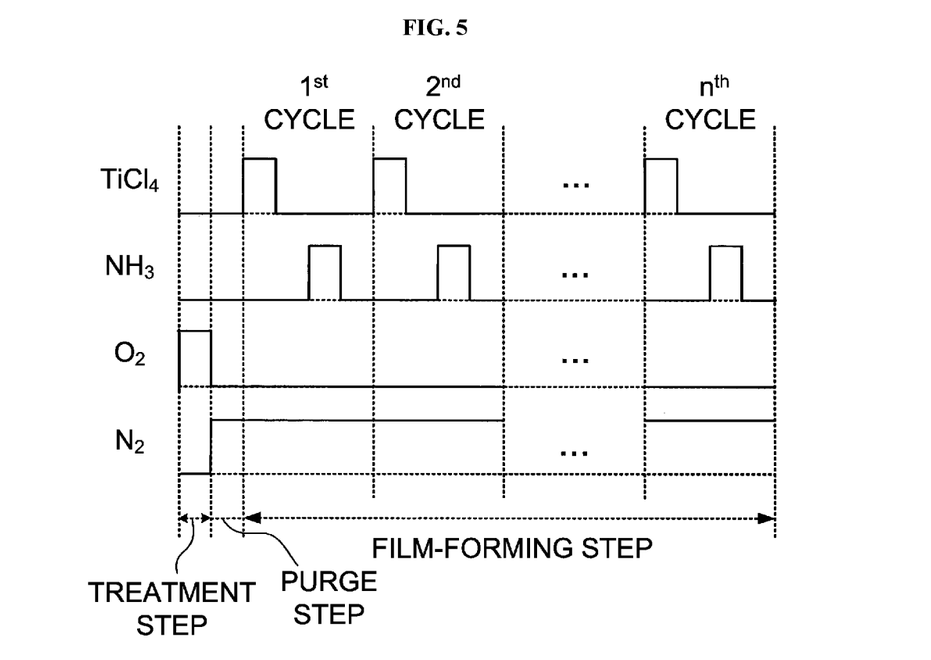
FIG. 5 is a flow chart schematically illustrating a film-forming sequence according to a modified example of the embodiments described herein.

FIG. 5 is a flow chart schematically illustrating a film-forming sequence according to a modified example of the embodiments described above. A treatment step performed before the film-forming step according to the modified example is different from that of the embodiments described above. The treatment step of the modified example is performed using the substrate processing apparatus 10. However, while the $SiH_4$ gas serving as the silane-based gas is supplied in the treatment step of the embodiments described above, the $O_2$ gas serving as the gas containing oxygen (O) (that is, an oxygen-containing gas) is supplied through the gas supply pipe 320 in the treatment step of the modified example.

<Treatment Step ($O_2$ Gas Supply)>

The valve 324 is opened to supply the $O_2$ gas serving as the oxygen-containing gas into the gas supply pipe 320. A flow rate of the $O_2$ gas supplied into the gas supply pipe 320 is adjusted by the MFC 322. The $O_2$ gas whose flow rate is adjusted is then supplied into the process chamber 201 through the plurality of the gas supply holes 420a of the nozzle 420, and is exhausted through the exhaust pipe 231. Thereby, the 02 gas is supplied to the plurality of the wafers including the wafer 200. In parallel with the supply of the $O_2$ gas, the valve 524 is opened to supply the inert gas such as the $N_2$ gas into the gas supply pipe 520. A flow rate of the $N_2$ gas supplied into the gas supply pipe 520 is adjusted by the MFC 522. The $N_2$ gas whose flow rate is adjusted is then supplied into the process chamber 201 together with the $O_2$ gas, and is exhausted through the exhaust pipe 231. In the treatment step, the valves 514 and 534 are closed to stop the supply of the $O_2$ gas through the nozzles 410 and 430.

In the treatment step, the APC valve 243 is fully opened. A supply flow rate of the $O_2$ gas controlled by the MFC 322 may be set to a flow rate ranging from 0.1 slm to 10 slm. For example, the supply flow rate of the $O_2$ gas may be set to 2 slm. A supply flow rate of the $N_2$ gas controlled by the MFC 522 may be set to a flow rate ranging from 0.1 slm to 20 slm. The inner pressure of the process chamber 201 in the treatment step is set to be lower than the inner pressure of the process chamber 201 in the film-forming step. In addition, the flow rate of the gas such as the $O_2$ gas supplied in the treatment step is set to be smaller than the flow rate of the gas such as the $TiCl_4$ gas supplied in the film-forming step described later. As a result, it is possible to distribute the $O_2$ gas throughout the process chamber 201, and it is also possible to selectively perform the treatment step only for the TiN film formed on such locations as the inner wall of the process chamber 201 and the dummy substrate without affecting the wafer 200 serving as the product wafer.

In the treatment step, the temperature of the heater 207 is set such that a temperature of the wafer 200 reaches and is maintained at a temperature ranging from 350° C. to 600° C. The temperature of the wafer 200 in the treatment step is set to be higher than the temperature of the wafer 200 in the film-forming step. In the treatment step, the higher the temperature of the wafer 200, the better the reactivity. Thus, it is preferable that the temperature of the wafer 200 in the treatment step is high. In addition, from the viewpoint of shortening a process time of the wafer 200 (that is, improving the manufacturing throughput), the temperature of the wafer 200 in the treatment step is set to be close to the temperature of the wafer 200 in the film-forming step. The smaller the temperature difference, the shorter the temperature adjustment time and the shorter the process time.

In the treatment step, the $O_2$ gas and the $N_2$ gas are supplied into the process chamber 201 without any other gas being supplied into the process chamber 201 together with the $O_2$ gas and the $N_2$ gas. By supplying the $O_2$ gas, the surface of the TiN film formed on such locations as the inner wall of the process chamber 201 is oxidized and oxygen atoms are diffused in the TiN film to change the crystallinity of the crystal grains. As a result, the titanium oxynitride film (TiNO film) or the titanium oxide film (TiO film) serving as the crystal grain fragmentation film is formed on the surface of the TiN film formed on such locations as the inner wall of the process chamber 201, and the surface of the TiN film is flattened.

The inner pressure of the process chamber 201 in the treatment step may be adjusted to a pressure closer to the atmospheric pressure rather than the pressure described above. By approaching inner pressure of the process chamber 201 to the atmospheric pressure, it is possible to improve a contact probability between molecules of the $O_2$ gas and the film to be processed (the TiN film in this case), and it is also possible to improve an oxygen adsorption rate on the surface of the film to be processed. That is, it is possible to improve a uniformity of an oxidation process.

<Purge Step (Residual Gas Removing)>

After a predetermined time has elapsed from the supply of the $O_2$ gas, the valve 324 is closed to stop the supply of the $O_2$ gas. In the purge step, with the APC valve 243 of the exhaust pipe 231 open, the vacuum pump 246 vacuum-exhausts the inner atmosphere of the process chamber 201 to remove a residual gas in the process chamber 201 such as the $O_2$ gas which did not react or which contributed to the formation of the TiNO film or the TiO film from the process chamber 201. In the purge step, with the valve 524 open, the valves 514 and 534 are opened to supply the $N_2$ gas into the process chamber 201. The $N_2$ gas serves as the purge gas, which improves the efficiency of removing the residual gas in the process chamber 201 such as the 02 gas which did not react or which contributed to the formation of the TiNO film or the TiO film from the process chamber 201.

Then, by performing the film-forming step described above, the TiN film is formed on the wafer 200 on which the oxide film exists.

According to the modified example of the embodiments described above, before forming the TiN film of a predetermined thickness (for example, 250 Å) on the wafer 200 on which the oxide film exists, the surface of the TiN film on such locations as the inner wall of the process chamber 201 is oxidized to form the oxide film such as the TiNO film and the TIO serving as the crystal grain fragmentation film. As a result, the growth of the TiN film by the nucleating type film-forming is stopped (disintegrated). Therefore, it is possible to suppress the film peeling of the TiN film formed in the process chamber 201, and it is also possible to prevent the TiN film formed in the process chamber 201 from adhering to the wafer 200 as the foreign substance. That is, it is possible to suppress the generation of the particles due to the film peeling of the TiN film in the process chamber 201.

Other Embodiments

For example, the above-described embodiments and the modified example are described by way of an example in which the substrate processing of forming the TiN film serving as the metal-containing film on the wafer on which the oxide film exists is performed in the process chamber wherein the TiN film serving as the metal-containing film exists on the inner wall or other location in the process chamber. However, the above-described technique is not limited thereto. For example, the above-described technique may be preferably applied when a substrate processing of forming a metal-containing film such as a tungsten (W) film, a molybdenum (Mo) film, a copper (Cu) film, a ruthenium (Ru) film and a molybdenum nitride (MoN) film on the wafer on which the oxide film exists is performed in the process chamber wherein the metal-containing film such as the W film, the Mo film, the Cu film, the Ru film and the MoN film exists on the inner wall or other location in the process chamber.

For example, the above-described embodiments and the modified example are described by way of an example in which the TiN film is formed on the wafer 200 on which the $SiO_2$ film serving as the oxide film exists. However, the above-described technique is not limited thereto. For example, the above-described technique may be preferably applied when the TiN film is formed on the wafer 200 on which an oxide film such as an aluminum oxide (AlO) film and a hafnium oxide (HfO) film exists.

For example, the above-described embodiments and the modified example are described by way of an example in which a step of supplying the metal-containing gas and a step of supplying the reactive gas are alternately and repeatedly performed as a step of forming the metal-containing film on the wafer 200. However, the above-described technique is not limited thereto. For example, the above-described technique may be preferably applied when the metal-containing film is formed by supplying the metal-containing gas without supplying the reactive gas.

For example, the above-described embodiments are described by way of an example in which the $SiH_4$ gas serving as the silane-based gas is used as the gas containing the group 14 element and hydrogen in the treatment step. However, the above-described technique is not limited thereto. For example, the above-described technique may be preferably applied when a silane-based gas such as disilane ($Si_2H_6$) gas and trisilane ($Si_3H_8$) gas is used in the treatment step instead of the $SiH_4$ gas. Even when the disilane gas or trisilane gas is used, it is possible to form the TiSiN film serving as a film containing the group 14 element on such locations as the inner wall of the process chamber.

For example, the above-described embodiments are described by way of an example in which the silane-based gas is used as the gas containing the group 14 element and hydrogen in the treatment step. However, the above-described technique is not limited thereto. For example, the above-described technique may be applied when a germanium (Ge)-based gas is used in the treatment step instead of the $SiH_4$ gas. As the germanium-based gas, a gas containing germanium (Ge) and hydrogen such as german ($GeH_4$) gas, digerman ($Ge_2H_6$) gas and trigerman ($Ge_3H_8$) gas may be used. When the germanium-based gas is used, it is possible to form a titanium germanium nitride (TiGeN) film serving as the film containing the group 14 element on such locations as the inner wall of the process chamber.

For example, the above-described modified example is described by way of an example in which the $O_2$ gas is used as the oxygen-containing gas in the treatment step. However, the above-described technique is not limited thereto. For example, the above-described technique may be applied when an oxygen-containing gas such as ozone ($O_3$) gas, nitric oxide (NO) gas and nitrous oxide ($N_2O$) gas is used in the treatment step instead of the $O_2$ gas.

For example, the above-described embodiments and the modified example are described by way of an example in which the treatment step is performed after the wafer with the oxide film formed thereon is loaded into the process chamber wherein the TiN film exists on the inner wall or other locations in the process chamber (that is, the treatment step is performed after the boat loading described above). However, the above-described technique is not limited thereto. For example, the above-described technique may be applied when the treatment step is performed before the wafer with the oxide film formed thereon is loaded into the process chamber wherein the TiN film exists on the inner wall or other locations in the process chamber (that is, the treatment step is performed before the boat loading described above). That is, the above-described technique may be applied when the treatment step is performed without loading the boat 217 into the process chamber 201. That is, the above-described technique may be preferably applied when the wafer with the oxide film formed thereon is loaded into the process chamber after the treatment step is performed in the process chamber and the film-forming step is performed after the wafer is loaded into the process chamber. In addition, the above-described technique may be applied when the treatment step is performed after the wafer is unloaded out of the process chamber after the film-forming step.

For example, the above-described embodiments and the modified example are described by way of an example in which the film-forming step is performed after the treatment step. However, the above-described technique is not limited thereto. For example, the above-described technique may be applied when the treatment step is performed every time the film forming step is performed or when the film-forming step and treatment step may be alternately and repeatedly performed. As a result, it is possible to disintegrate the crystal grains of the TiN film formed on such locations as the inner wall of the process chamber 201 every time the film-forming step is performed. In addition, the above-described technique may be applied when the treatment step is performed after the film-forming step is performed a predetermined number of times.

For example, the above-described embodiments are described by way of an example in which a batch type substrate processing apparatus configured to simultaneously process a plurality of substrates is used to perform the substrate processing. However, the above-described technique is not limited thereto. For example, the above-described technique may be applied when a single wafer type substrate processing apparatus configured to process one or several substrates at a time is used to perform the substrate processing.

It is preferable that the process recipe (that is, a program defining parameters such as process sequences and processing conditions of the substrate processing) used to form the above-described various films is prepared individually according to the contents of the substrate processing such as a type of the film to be formed, a composition ratio of the film, a quality of the film, a thickness of the film, the process sequences and the processing conditions of the substrate processing. That is, a plurality of process recipes are prepared. When starting the substrate processing, an appropriate process recipe is preferably selected among the plurality of the process recipes according to the contents of the substrate processing. Specifically, it is preferable that the plurality of the process recipes are stored (installed) in the memory 121c of the substrate processing apparatus in advance via an electric communication line or the recording medium (the external memory device 123) storing the plurality of the process recipes. Then, when starting the substrate processing, the CPU 121a preferably selects the appropriate process recipe among the plurality of the process recipes stored in the memory 121c of the substrate processing apparatus according to the contents of the substrate processing. Thus, various films of different types, composition ratios, different qualities and different thicknesses may be formed at the high reproducibility using a single substrate processing apparatus. In addition, since the burden on the operator such as inputting the processing sequences and the processing conditions may be reduced, various processes may be performed quickly while avoiding a malfunction of the apparatus.

The above-described technique may be implemented by changing an existing process recipe stored in the substrate processing apparatus to a new process recipe. When changing the existing process recipe to the new process recipe, the new process recipe may be installed in the substrate processing apparatus via the electric communication line or the recording medium storing the plurality of the process recipes. The existing process recipe already stored in the substrate processing apparatus may also be directly changed to the new process recipe according to the technique by operating the input/output device of the substrate processing apparatus.

The above-described technique is described in detail based on the above-described embodiments and the modified example. However, the above-described technique is not limited thereto. For example, the above-described embodiments and the modified example may be appropriately combined.

(5) Examples

Figure 6:
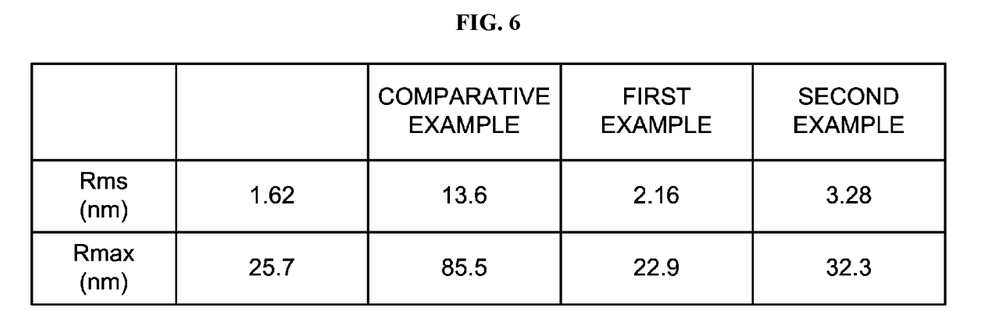
FIG. 6 is schematically illustrates a surface roughness of a titanium nitride film formed on a dummy substrate according to a comparative example and examples of the embodiments.

First, using the substrate processing apparatus 10 described above, without performing the treatment step shown in FIGS. 4 and 5 of the substrate processing described above, a film of a thickness of 250 Å is formed on the dummy substrate in the process chamber 201 in which the TiN film is not formed. Then, the surface of the TiN film formed on the dummy substrate is observed using an AFM (atomic force microscopy). As shown in FIG. 6, the root mean square (Rms) of the surface of the TiN film formed on the dummy substrate is 1.62 nm, and the maximum height difference (Rmax) is 25.7 nm. Then, the dummy substrate with the TiN film of a thickness of 250 Å formed thereon loaded into the process chamber 201 wherein the TiN film is formed on the inner wall or other locations in the process chamber 201, and a comparative example, a first example and a second example according to the present embodiments described later are performed to process the dummy substrate. The surfaces of the TiN films formed according to the comparative example, the first example and the second example are observed using the atomic force microscopy.

According to the comparative example, using the substrate processing apparatus 10 described above, the dummy substrate with the TiN film of a thickness of 250 Å formed thereon is loaded as it is into the process chamber 201 wherein the TiN film is formed on the inner wall or other location in the process chamber 201.

Then, without performing the treatment step shown in FIGS. 4 and 5, a TiN film of a thickness of 250 Å is further formed on the dummy substrate with the TiN film of a thickness of 250 Å formed thereon, and the surface of the TiN film further formed on the dummy substrate is observed using the atomic force microscopy.

According to the first example, using the substrate processing apparatus 10 described above, the dummy substrate with the TiN film of a thickness of 250 Å formed thereon is loaded as it is into the process chamber 201 wherein the TiN film is formed on the inner wall or other location in the process chamber 201. Then, a TiN film of a thickness of 250 Å is further formed on the dummy substrate with the TiN film of a thickness of 250 Å formed thereon according to the film-forming sequence shown in FIG. 4 (that is, the treatment step of supplying the $SiH_4$ gas is performed before the film-forming step), and the surface of the TiN film further formed on the dummy substrate is observed using the atomic force microscopy.

According to the second example, using the substrate processing apparatus 10 described above, the dummy substrate with the TiN film of a thickness of 250 Å formed thereon is loaded as it is into the process chamber 201 wherein the TiN film is formed on the inner wall or other location in the process chamber 201. Then, a TiN film of a thickness of 250 Å is further formed on the dummy substrate with the TiN film of a thickness of 250 Å formed thereon according to the film-forming sequence shown in FIG. 5 (that is, the treatment step of supplying the $O_2$ gas is performed before the film-forming step), and the surface of the TiN film further formed on the dummy substrate is observed using the atomic force microscopy.

As shown in FIG. 6, according to the comparative example, the root mean square (Rms) of the surface of the TiN film further formed on the dummy substrate is 13.6 nm, and the maximum height difference (Rmax) is 85.5 nm. According to the first example, the root mean square (Rms) of the surface of the TiN film further formed on the dummy substrate is 2.16 nm, and the maximum height difference (Rmax) is 22.9 nm. According to the second example, the root mean square (Rms) of the surface of the TiN film further formed on the dummy substrate is 3.28 nm, and the maximum height difference (Rmax) is 32.3 nm.

According to evaluation results of the surface of the TiN film in the comparative example, the first example and the second example, it is confirmed that the root mean square and the maximum height difference of the surface of the TiN film is greater and a growth speed of the TiN film is higher as compared with those of the first example and the second example.

That is, when the film-forming step is performed in the process chamber 201 with the TiN film formed therein, by performing the treatment step before performing the film-forming step, it is confirmed that the root mean square and the maximum height difference of the surface of the TiN film are reduced and the growth of the TiN film is suppressed as compared with the case where the treatment step is not performed. That is, it is confirmed that the growth of the film by the nucleating type film-forming on such locations as the inner wall of the process chamber 201 and the dummy substrate can be suppressed by performing the treatment step before performing the film-forming step.

In addition, a silicon distribution in a depth direction of each TiN film is evaluated using a secondary ion mass spectrometry (SIMS) when the TiN film is formed on the wafer with the $SiO_2$ film formed thereon without performing the treatment step described above, when the TiN film is formed on the wafer after the treatment step of supplying the $O_2$ gas is performed, when the TiN film is formed on the wafer after the treatment step of supplying the $SiH_4$ gas is performed for 3 minutes, when the TiN film is formed on the wafer after the treatment step of supplying the $SiH_4$ gas is performed for 5 minutes, and when the TiN film is formed on the wafer after the treatment step of supplying the $SiH_4$ gas is performed for 7 minutes.

In each case described above, there is no change in the silicon distribution in the depth direction of the TiN film. That is, it is confirmed that the treatment step can be selectively performed on such locations as the inner wall of the process chamber 201 without causing an influence such as composition change in the depth direction of the TiN film of the wafer. Therefore, it is confirmed that the treatment step can be selectively applied only to the TiN film formed on such locations as the dummy substrate and the inner wall of the process chamber 201 without affecting the product wafer.

According to some embodiments in the present disclosure, it is possible to suppress the generation of the particles due to the film peeling in the process chamber.

What is claimed is:

1. A method of manufacturing a semiconductor device, comprising:
   (a) loading a substrate with an oxide film formed thereon into a process chamber wherein a metal-containing film is formed on a wall or other location in the process chamber;
   (b) supplying into the process chamber with at least one among: a gas containing a group 14 element and hydrogen; and a gas containing oxygen; and
   (c) forming the metal-containing film on the substrate after (b),
   wherein (c) comprises:
   (d) supplying a metal-containing gas to the substrate; and
   (e) supplying a reactive gas,
   wherein (d) and (e) are alternately and repeatedly performed in (c).

2. The method of claim 1, wherein a film containing the group 14 element and hydrogen is formed on a wall of the process chamber in (b) by supplying the gas containing the group 14 element and hydrogen.

3. The method of claim 1, wherein the gas containing the group 14 element and hydrogen comprises at least one among $SiH_4$, $Si_2H_6$ and $Si_3H_8$.

4. The method of claim 2, wherein the gas containing the group 14 element and hydrogen comprises at least one among $SiH_4$, $Si_2H_6$ and $Si_3H_8$.

5. The method of claim 1, wherein the gas containing the group 14 element and hydrogen comprises at least one among $GeH_4$, $Ge_2H_6$ and $Ge_3H_8$.

6. The method of claim 1, wherein the metal-containing film formed on the wall of the process chamber is modified into a metal oxide film in (b) by supplying the gas containing oxygen.

7. The method of claim 1, wherein an inner pressure of the process chamber is lower in (b) than in (c), and a flow rate of gas supply is smaller in (b) than in (c).

8. The method of claim 2, wherein an inner pressure of the process chamber is lower in (b) than in (c), and a flow rate of gas supply is smaller in (b) than in (c).

9. The method of claim 3, wherein an inner pressure of the process chamber is lower in (b) than in (c), and a flow rate of gas supply is smaller in (b) than in (c).

10. The method of claim 1, wherein an inner temperature of the process chamber is higher in (b) than in (c).

11. The method of claim 1, wherein (a) and (c) are performed after (b) is performed.

12. The method of claim 1, wherein (b) and (c) are alternately and repeatedly performed.

13. The method of claim 11, wherein (b) and (c) are alternately and repeatedly performed.

14. The method of claim 1, further comprising
   (f) exhausting an inside of the process chamber such that an inner pressure of the process chamber reaches a predetermined pressure, and heating the process chamber such that a predetermined temperature distribution of an inner temperature of the process chamber is obtained.

15. The method of claim 1, wherein a titanium nitride film is formed as the metal-containing film in (c).

16. A non-transitory computer-readable recording medium storing a program that causes, by a computer, a substrate processing apparatus to perform:
   (a) loading a substrate with an oxide film formed thereon into a process chamber wherein a metal-containing film is formed on a wall or other location in the process chamber;

(b) supplying into the process chamber with at least one among: a gas containing a group 14 element and hydrogen; and a gas containing oxygen; and (c) forming the metal-containing film on the substrate after (b), wherein (c) comprises:

(d) supplying a metal-containing gas to the substrate; and (e) supplying a reactive gas, wherein (d) and (e) are alternately and repeatedly performed in (c).

17. A substrate processing apparatus comprising:

a process chamber in which a metal-containing film is formed;

a transfer system configured to load a substrate into the process chamber;

a gas supply system configured to supply into the process chamber with a metal-containing gas or at least one among: a gas containing a group 14 element and hydrogen; and a gas containing oxygen;

an exhaust system configured to exhaust an inside of the process chamber; and a controller configured to control the transfer system, the gas supply system and the exhaust system to perform:

(a) loading the substrate with an oxide film formed thereon into the process chamber;

(b) supplying into the process chamber with at least one among: the gas containing the group 14 element; and hydrogen and the gas containing oxygen; and (c) forming the metal-containing film on the substrate after (b), wherein (c) comprises:

(d) supplying the metal-containing gas to the substrate; and (e) supplying a reactive gas, wherein (d) and (e) are alternately and repeatedly performed in (c).

* * * * *